May 10, 1960 C. A. STEGGERDA 2,936,424
TRANSISTOR AMPLIFIER
Filed April 28, 1955
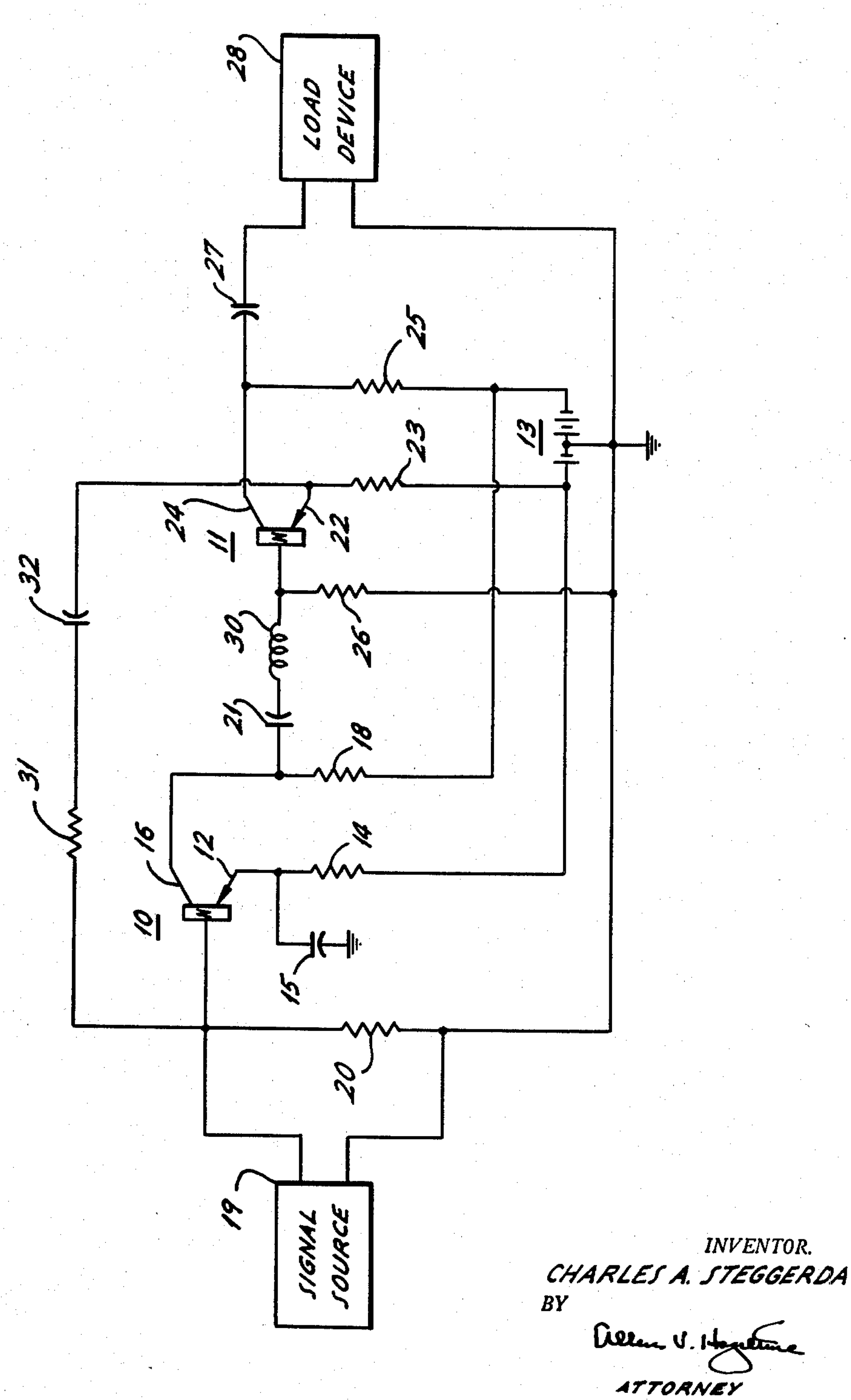
INVENTOR.
CHARLES A. STEGGERDA
BY
Allen V. Hazeltine
ATTORNEY United States Patent Office 2,936,424

Patented May 10, 1960

2,936,424

TRANSISTOR AMPLIFIER

Charles A. Steggerda, Windsor, Conn., assignor to Philco Corporation, Philadelphia, Pa., a corporation of Pennsylvania Application April 28, 1955, Serial No. 504,407

2 Claims. (Cl. 330—21)

The present invention relates to circuit arrangements utilizing semiconductor devices, and more particularly to improved transistor amplifying circuits.

In the design of transistor amplifying circuits, it has been found that conventional cascading of ordinary transistor stages often results in an amplifier having too low a power gain or too narrow a bandwidth for certain important applications. For example, an amplifier comprising a series of cascaded, common-base stages using transistors having current gains of less than unity may be designed to provide a wide bandwidth, but is ordinarily characterized by low power gain; if the input impedance and output impedance of such an amplifier are equal, its power gain is in fact less than unity. In the usual common-emitter cascaded amplifier, on the other hand, relatively high power gain may be obtained, but the bandwidth is relatively narrower than in the common-base configuration and, particularly for some video amplification purposes, is often entirely inadequate. Furthermore, the technique of varying the value of load impedance in each stage, which is commonly used in vacuum tube circuits to vary the bandwidth, is in general not effective in the type of transistor circuits considered herein, since the bandwidth limitation in the latter case is usually due not to the collector capacitance but to the alpha-cutoff frequency $f_{c\alpha}$ of the transistors employed.

In order to obtain the desired bandwidth and gain, it is possible to modify a cascaded, common-emitter, transistor amplifier by providing negative feedback in the form of a feedback path from one transistor to a preceding stage, the electrode to which the feedback is applied being chosen to provide the desired degeneration.

However, I have found that those negative feedback transistor circuits existing in the prior art which are successful in producing substantial increases in bandwidth typically possess certain other undesirable characteristics arising primarily because of the unique properties of transistors as amplifying elements. Thus it has been found that, in such prior art circuits, increases in bandwidth are accompanied by substantially more than proportional decreases in voltage amplification, so that the amplification-bandwidth product is deteriorated, usually due to the loading of, and consequent diversion of current from, the collector by the feedback path. Second, it has been found that such circuits possess characteristics which are relatively strongly dependent upon the nature of the systems into which they are connected, and in particular that the bandpass characteristics are markedly dependent upon the impedance of the load connected to the amplifier.

Accordingly, it is an object of my invention to provide an improved transistor amplifier circuit.

Another object is to provide an improved feedback arrangement for semiconductive amplifiers.

Still another object is to provide an efficient circuit arrangement for permitting the trading of amplification for additional bandwidth in a common-emitter, transistor amplifier.

It is a still further object to provide a transistor amplifying circuit utilizing a plurality of common-emitter transistor stages in cascade and a negative feedback loop therein for increasing the bandwidth of the amplifier, which circuit has a bandwidth relatively insensitive to variations in the impedances of the devices connected to the input and output terminals thereof, and particularly insensitive to variations in the load impedance.

Another object is to provide a transistor amplifying circuit employing cascaded, common-emitter stages and utilizing negative feedback, in which the amplification-bandwidth product available is large and the number of circuit elements required is small.

The above objectives are achieved in accordance with the invention by providing a transistor circuit comprising a series of cascaded, common-emitter stages, at least one of which stages contains an impedance in the emitter circuit thereof; a degenerative feedback path is also provided between the emitter circuit of the latter transistor and the base of a transistor earlier in the cascade series. Preferably, the feedback is from the emitter of one transistor to the base electrode of the immediately preceding transistor. Input signals may then be applied to the base element of the first transistor in the series, and output signals taken from the collector of the last stage in the usual manner.

The values of the emitter impedance and the feedback impedance referred to hereinbefore are selected in a manner described in detail hereinafter, to provide the amount of passband-widening required in the particular application. It has been found that, by appropriate adjustment of the emitter and feedback impedances, the bandwidth of the amplifier may be changed substantially all the way from the relatively narrow bandwidth which is obtained without feedback and utilizing common-emitter stages, to the broader bandwidth which can be obtained utilizing grounded-base stages, and that this adjustment can be accomplished without substantial deterioration of the amplification-bandwidth product of the amplifier, or even with improvement therein.

With the circuit of the invention, relatively high amplification is preserved, in part because there is substantially no loading of the output signal by the feedback path. This in turn is because the feedback path is not directly connected into the output circuit, and the emitter to which it is connected is a low impedance point and hence not greatly loaded by the impedance of the base circuit to which the feedback path supplies signals. Furthermore, since the feedback path is connected to the emitter, variations in the impedance of the load connected to the collector do not directly affect the amount of feedback, and the characteristics of the amplifier therefore tend to be substantially the same for different values of load impedance.

In a preferred embodiment of the invention to be described in detail hereinafter, the forward signal path between the two cascaded, common-emitter transistor stages is provided by a coupling circuit which includes a series inductance, chosen to resonate with the input and output capacitances of the first and second stages, respectively, whereby unusually high amplification-bandwidth products are obtained in the amplifier.

Other objects and features of the invention will be more apparent from a consideration of the following detailed description, taken in connection with the accompanying figure, which is a schematic diagram of a typical embodiment thereof.

The circuit shown in the figure comprises a pair of common-emitter transistor stages in cascade, the first transistor 10 and the second transistor 11 preferably comprising surface-barrier transistors of the general type described in the copending application Serial No. 472,-826 of R. A. Williams and J. W. Tiley, filed December 3, 1954 and entitled, "Electrical Device." Such transistors are preferred since they possess the high high values of common-base alpha-cutoff frequency $f_{c\alpha}$ desirable for wide-band operation; however, junction-type transistors may also be utilized in applications where less bandwidth is needed. The emitter 12 of transistor 10 is connected to the positive terminal of battery 13 by way or resistor 14, and is bypassed to ground by capacitor 15, while the collector 16 thereof is connected to the negative terminal of battery 13 by way of collector load resistor 18.

Input signals to be amplified are applied between the base of transistor 10 and a grounded tap on battery 13 from a signal source 19, which ordinarily is such as to provide signals having frequency components occupving a relatively wide band and which are to be amplified without substantial amplitude discrimination. For example, source 19 may comprise a generator of very short, rectangular pulses, which are to be amplified without substantial distortion of waveshape, or in some instances may merely comprise earlier amplifying stages of the same type as shown, or some other signal-translating device for supplying signals to transistor 10. Resistor 20 is connected between ground and the base of transistor 10, to provide a direct-current path for the base current of transistor 10. Coupling capacitor 21, connected to collector 16, serves to supply the output signals of transistor 10 to the following stage, while removing the D.-C. component thereof.

The second amplifying stage in the figure, comprising transistor 11, may be similar in form to the first stage with the exception that the emitter resistance is unbypassed so as to permit the development of signal voltages thereacross. Thus the emitter 22 of transistor 11 is connected to the positive terminal of battery 13 by way of unbypassed resistor 23, while the collector 24 is connected to the negative terminal of battery 13 by way of collector resistor 25. Bias for the base of transistor 11 is supplied from the grounded tap of battery 13 by resistor 26, and a coupling capacitor 27 connects collector 24 to the load device 28, which may be the ultimate signal-utilization device or may comprise additional amplifying or signal-translating circuits.

Coupling between the two amplifying stages is completed by the provision of the series inductor 30 which, while not essential to the use of the feedback arrangement to be described presently in detail, nevertheless is utilized in the preferred embodiment to obtain greatest possible bandwidth for each value of gain. Inductor 30 provides a transformer effect between the stages by resonating with the output capacity of the first stage and the input capacity of the second stage. When properly adjusted as described further hereinafter, this inductor is capable of approximately doubling the bandwidth of the amplifier.

The portions of the circuit of the figure thus far described in detail are generally conventional as to their arrangement and characteristics, and their individual functions need not be described in detail herein. In general, the signals from source 19 applied to the transistor 10 are amplified therein, passed through the interstage coupling network to transistor 11, amplified again therein and supplied to the load device 28. However, although the gain of the circuit thus far described may be relatively high, the bandwidth of the circuit between signal source 19 and load device 28 is relatively low. For example, in a typical embodiment using transistors having alpha-cutoff frequencies $f_{c\alpha}$ of about 44 megacycles/second and grounded-base current gains $\alpha_0$ of about 0.91, the overall bandwidth may typically by the order of 3 megacycles/second, although the gain may in this case readily be as high as about 36 decibels. Adjustment of the values of the collector resistors has little effect upon the bandwidth in this arrangement, since the factor primarily responsible for the bandwidth limitation is not the collector capacitance, but the alpha-cutoff frequency $f_{c\alpha}$ of the transistors.

The desired exchange of gain for bandwidth is made possible by the addition of the path comprising feedback resistor 31 and blocking capacitor 32, connected in series between the unbypassed emitter of the second transistor 11 and the base of the first transistor 10. Since low-frequency signals experience a phase-shift of 180° in traversing transistor 10 but none in travelling from base to emitter in transistor 11, the low-frequency signals fed back through resistor 31 are of the phase to produce degeneration. However, for higher frequency signals the voltage gain of the transistors becomes progressively less and therefore the degeneration of progressively less, resulting in a widening of the passband of the complete amplifier. In addition at very high frequencies the transit-time phase-shift becomes progressively greater, thus producing positive or regenerative feedback which also increases the bandwith. The greater the amount of feedback, in general the greater is the amount by which the bandwich of the amplifier is increased. It will be understood that capacitor 32 is in this case sufficiently large to produce negligible phase shift in itself, and is merely for the purpose of preserving D.-C. isolation between the stages; such a capacitor is therefore not necessary if the bias of the emitter 22 is adjusted to provide a D.-C. base bias suitable for operation of transistor 10.

The bandwidth and voltage amplification of the amplifier of the figure have been found to depend principally upon the resistance $r$ of feedback resistor 31, and also upon the resistance R of the emitter resistor 23 of second transistor 11. For a fixed value of R, the effect of decreasing the value $r$ of resistor 31 from very large values is to increase the feedback factor so that more and more of the emitter current of transistor 11 flows into the base of transistor 10 in degenerative phase, increasing the overall bandwidth and reducing the amplification. Over a large range of variation in $r$, the increases in bandwidth thus produced are at least as great as the corresponding decreases in amplification, and the amplification-bandwidth product of the amplifier remains substantially constant or may even increase as the bandwidth is increased.

The effects of increasing the emitter resistance R are primarily to increase both the single-stage degeneration in the circuit of the second transistor and the amount of signal voltage supplied to the feedback loop. Increases in single-stage degeneration have the effect of increasing the input impedance of transistor 11, and thereby increasing the amount of current diverted into base resistor 26 with resultant loss in power gain. Though this loss can be minimized by using relatively large values of base resistor 26, it is nevertheless generally desirable to utilize as small a value of emitter resistance R as will provide sufficient signal for the feedback path.

I have also found that for the optimum in amplification-bandwidth product, the product $Rr$ of the values of resistors 31 and 23 is substantially equal to a constant value in any given circuit. That is, for large bandwidths R is preferably large and $r$ is preferably small, while for large amplification R is preferably small and $r$ large. As an example for a typical circuit, the product $Rr$ may be about 180,000 ohms. However excellent amplification-bandwidth products and control of amplification and bandwidth may be obtained when R is fixed at a moderately low value and $r$ alone is varied. This makes possible a variable-bandwidth circuit requiring but a single variable element, as exemplified hereinafter by the last three rows of Table I.

Values of the elements of the figure, exclusive of resistances 23 and 31 and inductor 30, may be as follows in one embodiment of the invention particularly adapted for use as an amplifier of controllably variable bandwidth:

| | |
|---|---|
| Transistors **10** and **11** | Surface-barrier transistors, having $\alpha_0$ of about 0.91, and $f_{c\alpha}$ of about 36 mcs. |
| Resistor **14** | 2,200 ohms. |
| Capacitor **15** | 10 microfarads. |
| Voltage of source **13** | +4.5 volts total; +3 volts at tap. |
| Resistor **18** | 2,200 ohms. |
| Internal impedance of source **19** | 1,000 ohms. |
| Resistor **20** | 10,000 ohms. |
| Capacitor **21** | 0.1 microfarads. |
| Resistor **25** | 1,200 ohms. |
| Resistor **26** | 82,000 ohms. |
| Capacitor **27** | 0.1 microfarads. |
| Internal impedance of load device **28** | 1,000 ohms. |
| Capacitor **32** | 0.1 microfarads. |

Utilizing these circuit values, typical values of bandwidth, amplification and amplification-bandwidth product per stage for several values of resistors 23 and 31, and inductor 30 may be approximately as shown in the following table:

*Table I*

| Resistor 23, ohms | Resistor 31, ohms | Inductor 30, microhenries | Total Bandwidth, mc./s. | Total Gain, db | Amplification, Bandwidth per Stage |
|---|---|---|---|---|---|
| 0 | ∞ | 10–22 | 2.2 | 39.6 | 33.6 |
| 120 | 2,200 | 20–70 | 5.0 | 27.4 | 38 |
| 120 | 680 | 10–22 | 9.8 | 19 | 46.6 |
| 120 | 180 | 7–11 | 17 | 11.7 | 52 |

The first row of Table I indicates that when the resistance in the emitter circuit of the second stage is zero and the feedback path is open, the bandwidth of the two stages is only 2.2 megacycles/second and the gain is 39.6 decibels. With a 120 ohm resistor in the emitter circuit of the second stage and the feedback path closed, the bandwidth is increased progressively to 5, 9.8 and 17 megacycles/second for feedback resistances of 2,200, 680 and 180 ohms, respectively, with correspondingly reduced values of gain of 27.4, 19 and 11.7 decibels respectively. As is shown in the last column of Table I, the amplification-bandwidth product per stage actually increases in this case, from 33.6 mc. with no feedback, to 52 mc. with the greatest amount of feedback shown. Where large amplifications are not required, bandwidths even greater than the 17 mc. indicated may be obtained by further adjustments of the feedback path, bandwidths of 33 mc. having been obtained with voltage amplification of 4.5 db for example.

The values of inductor 30 shown in Table I indicate the approximate ranges utilized, and it will be understood that in each case the inductor is preferably adjusted to provide maximum bandwidth. As a guide in selecting and adjusting the value of inductor 30, I have found the following approximate relation to be helpful:

$$L=\frac{1-\alpha_0}{\omega^2 C_c}$$

where L is the inductance of inductor 30, $\alpha_0$ is the grounded-base current gain of the first transistor 11, $\omega$ is the mid-band angular frequency of the passband to be provided and $C_c$ is the collector capacity of the first transistor 10.

While not wishing to be bound by the specific details of any particular theory, the following general relations are useful in selecting values of feedback resistance $r$ and emitter resistance R in the practical range of greatest interest. The gain G is given roughly by the expression:

$$G=\frac{R+r}{R}\alpha_0^1$$

where $\alpha_0^1$ is the low frequency $\alpha$ of the first transistor. The bandwidth W is given roughly by the relation:

$$W=\frac{\alpha_0 R}{R+r}(f_{c\alpha}f_{c\alpha}^1)^{1/2}$$

where $\alpha_0$ is the low-frequency $\alpha$ of the transistors, $f_{c\alpha}$ is the alpha-cutoff frequency of the first transistor 10 and $f_{c\alpha}^1$ is the alpha-cutoff frequency of the second transistor 11.

With the circuit shown and described, it has been found that the transient response is excellent and the tendency toward ringing and oscillation substantially nil. Furthermore, the bandwidth is in large measure independent of the impedance connected to the collector of the second transistor 11. This is because the feedback loop is connected to the emitter element of the second stage, which element is not materially affected by the collector potential unless the impedance connected to the collector is large enough to be comparable to the output impedance of the transistor 11. Ordinarily this condition will require a load impedance comparable to the product $r_c(1-\alpha_0)$, where $r_c$ is the collector resistance of transistor 11, an adjustment which is not ordinarily desirable in practical, temperature-stable amplifiers.

It is therefore possible to utilize the cascaded pair of transistor stages shown in the figure in many applications as an amplifier of substantially fixed bandwidth. Thus it may be utilized in the general arrangement shown in the figure between a high impedance source of signals and a low impedance load, as is often convenient. It may also be preceded and/or followed by similar cascaded pairs of transistor stages to provide a wide-band video amplifier of even greater gain. By making resistor 31 variable, an amplifier of easily controlled bandwidth is provided.

Although the invention has been described with particular reference to a specific embodiment thereof, it will be understood that it is susceptible of embodiment in a variety of forms without departing from the scope of the invention. Thus it will be understood that selective feedback of certain frequency components may be accomplished, where desired, by including substantial reactive components in the impedances of the feedback circuit and/or the emitter circuit of the second transistor. Also, it will be appreciated that the blocking condensers in the interstage forward signal path and/or in the feedback path need not be included, provided that the biases of the various elements of the two stages are adjusted to permit direct coupling. Furthermore, although best results have been obtained using feedback from one stage to the base of the immediately preceding stage, it is also possible in some applications to include additional stages between the one from which feedback is taken and that to which it is applied. Finally, the invention is not limited to circuits using surface-barrier transistors having N-type base regions, but may utilize other transistors such as junction transistors, or transistors having P-type bodies, provided that appropriate reversal of the polarities of the biasing voltages is made in a manner well known in the art.

I claim:

1. A common-emitter transistor amplifier of wide passband and large gain-bandwidth product, comprising a first transistor and a second transistor each arranged in the common-emitter connection and each having emitter, collector and base elements, means coupling the collector circuit of said first transistor to the base circuit of said second transistor, said means comprising an inductive element resonating with the output impedance of said first transistor at a frequency within said passband, a collector impedance element connected in the collector circuit of said second transistor between said collector element of said second transistor and a point at reference potential, said collector impedance element having an impedance which is substantial at frequencies within said passband but smaller than the output impedance of said second transistor, an emitter impedance element connected in the emitter circuit of said second transistor between said emitter element thereof and said point at reference potential and also having substantial impedance at frequencies within said passband, feedback means for supplying signals in degenerative phase from said emitter impedance element to said base element of said first transistor, and means for deriving output signals from across said collector impedance element.

2. The amplifier of claim 1, in which said inductive element has an inductance of the order of $$\frac{1-\alpha_0}{\omega^2 C}$$

where $\alpha_0$ is the common-base current gain of said first transistor, $\omega$ is the angular frequency of the middle of said passband, and C is the collector capacity of said first transistor.

References Cited in the file of this patent

UNITED STATES PATENTS

| | | |
|---|---|---|
| 2,282,381 | Root | May 12, 1942 |
| 2,668,881 | Crosby | Feb. 9, 1954 |
| 2,760,007 | Lozier | Aug. 21, 1956 |
| 2,762,875 | Fischer | Sept. 11, 1956 |
| 2,764,643 | Sulzer | Sept. 25, 1956 |
| 2,784,262 | Crow | Mar. 5, 1957 |

OTHER REFERENCES

"Electrical Engineering," September 1953, pages 358–364, "Transistor Circuits and Applications," G. C. Sziklai.

"Proceedings of I.R.E.," December 1953, pages 1709–1712 (particularly Fig. 22) part Fig. 2) Angell et al. "Circuit Applications of Surface-Barrier Transistors."

Shea: "Principles of Transistor Circuits," John Wiley & Sons publ. 1953 (part page 167 Fig. 85 and discussion of duality page 295 etc., and Fig. 16.10 page 351).

Publication, Riddle, "Practical-Amplifiers," Electronics, April 1954, pages 169–171.

"Radiotron Designer's Handbook," fourth edition, 1952, pages 311, 312, 315.